(12) United States Patent
Deliwala et al.

(10) Patent No.: US 7,737,409 B2
(45) Date of Patent: Jun. 15, 2010

(54) SILICON DETECTOR AND METHOD FOR CONSTRUCTING SILICON DETECTORS

(75) Inventors: Shrenik A. Deliwala, Andover, MA (US); Michael C Coln, Lexington, MA (US); Alain Valentin Guery, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 144 days.

(21) Appl. No.: 12/138,078

(22) Filed: Jun. 12, 2008

(65) Prior Publication Data

US 2009/0309036 A1    Dec. 17, 2009

(51) Int. Cl.
*G01T 1/24* (2006.01)
(52) U.S. Cl. .................................. 250/370.01
(58) Field of Classification Search . 250/370.1–370.15; 378/98.8; 257/233, 301, 117, 118, 127, 170, 257/244, 332, 374, 397, 510, 513, 514, 515, 257/519, 520, 534, 559, 571, 586, 594, 599, 257/622, E27.126, E29.121, E29.201, E29, 257/618, 535, 527, 500, 499, 311, 304, 260, 257/E29.26, E21.231, E21.238, E21.553, 257/E21.585, 929
See application file for complete search history.

(56) References Cited

U.S. PATENT DOCUMENTS 3,864,722 A * 2/1975 Carnes ....................... 257/231
4,029,962 A * 6/1977 Chapman .................. 250/338.4
4,278,046 A * 7/1981 Clarke et al. ................. 118/695
5,525,828 A    6/1996 Bassous et al.
6,114,805 A * 9/2000 Codama et al. ............. 313/509
2003/0022475 A1    1/2003 Vieux-Rochaz et al.

FOREIGN PATENT DOCUMENTS

| EP | 0926726 A1 | 6/1999 |
|---|---|---|
| EP | 1569275 A1 | 8/2005 |
| WO | 2004084300 A1 | 9/2004 |

* cited by examiner

*Primary Examiner*—David P Porta
*Assistant Examiner*—Kiho Kim
(74) *Attorney, Agent, or Firm*—Kenyon & Kenyon LLP (57) ABSTRACT

Described is a die having photodetectors provided on a first surface thereof. The die includes an insulative shell member, a conductive shell member and a photodetector conductor. The insulative shell member extends around a periphery of the photodetector receptors and extending through a depth of the semiconductor die. The conductive shell member bridges the insulative shell member and extends through the depth of the semiconductor die. The photodetector conductors are provided on the first surface of the semiconductor die and electrically couple respective photodetectors with a corresponding conductive shell member. Also described is a process for making a semiconductor die and an integrated circuit structure.

16 Claims, 9 Drawing Sheets

610 → Providing phootodetectors on a first surface of a semiconductor die,

630 → Extending insulative shell members around a periphery of the photodetectors and extending through a depth of the semiconductor die 650 → Bridging the insulative shell members conductive shell members and extending the conductive shell members through the depth of the semiconductor die to a contact on a second surface, opposite the first, of the integrated circuit structure 670 → Provided on the first surface of the semiconductor die photodetector conductors that electrically couple respective photodetectors with corresponding conductive shell member 690 → Forming, on the second surface, current paths connected to the conductive shell members extending through the depth of the semiconductor die

SILICON DETECTOR AND METHOD FOR CONSTRUCTING SILICON DETECTORS

BACKGROUND

The present invention is directed to a three dimensional structure for a photodetector device and specifically, to such a device constructed using dielectrically isolated silicon pathways to directly connect the top side of the photodetectors (photodiodes) on a substrate to a point on the bottom of the substrate.

Optical detectors typically include a one- or two-dimensional array of photodetectors provided on a front surface of a semiconductor die. The photodetectors typically generate charge in response to light that illuminates the front surface of the die. Optical detectors further include wiring and other electronic devices to address each photodetector on the die and read accumulated charge therefrom. The wiring and addressing devices typically are provided on the front surface of the die and block light. This wiring and addressing devices can impair performance of the optical detector. Accordingly, designers of optical detectors take great care to maximize the ratio of useful area of a die (the unblocked portion that can be used as photodetectors) to the total area of the die (both the blocked and unblocked portions).

The inventors perceive a need in the art to provide improved structures for photodetectors and, specifically, to provide a semiconductor die that avoids use of wiring and addressing devices on the front surface of the die.

DETAILED DESCRIPTION

To overcome the problems associated with rear-illumination photodetectors, the disclosed construction can allow for a high yield and direct bonding to carrier substrate thus reducing the interconnect capacitance, which can improve noise performance of electronic amplifiers.

Embodiments of the present invention relate to an integrated circuit structure, including a semiconductor die having photodetectors provided on a first surface thereof. An insulative shell member extends around a periphery of the photodetectors and extends through a depth of the semiconductor die. A conductive shell member bridges the insulative shell member and extends through the depth of the semiconductor die. Photodetector conductors are provided on the first surface of the semiconductor die and are electrically coupled to respective photodetectors with a corresponding conductive shell member.

Other embodiments of the present invention relate to a silicon board that includes substrate layers bonded together. The bonded substrate layers have a first side for receiving radiation and a second side for making electrical connections. The bonded substrate layers are doped to provide a photodiode capability between the first side and the second side. A plurality of dual-walled insulating regions formed through the substrate layers from the first side to the second side and open on the ends. Each of the plurality of dual-walled insulating regions encloses a portion of the substrate layers, the enclosed portion of the substrate layers forming a photodiode and enclosing an insulating region via adjacent to the photodiode. An electrical contacting material bridges the plurality of insulating regions on the first side of the substrate layers and connects to an electrical connection region on the second side of the substrate layers through the insulating region via.

Recent advances in laterally isolated silicon regions with vertical dielectrically filled trenches in a bulk silicon wafer facilitate implementation of the exemplary embodiments of the present invention. For example, WO 2004/084300 shows silicon thru vias are made that isolate one region of silicon from the others thus enabling one to make fully isolated islands of silicon. This kind of isolation is routinely done for the device layer of silicon-on-insulator (SOI) substrates. In this case, only the thin (<10 μm) top layer of the device is isolated. The contact to the bottom electrodes are still done from the top-side or the front-side. This inhibits the use of the dielectric isolation technology from being used in rear-illumination applications.

Figure 1:
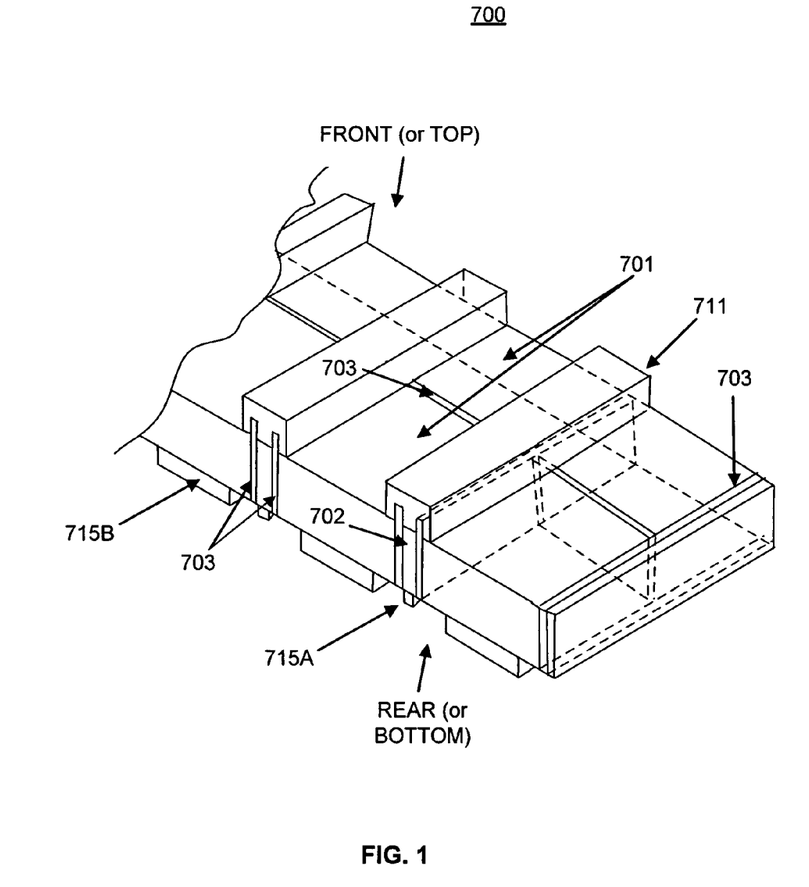
FIG. 1 illustrates a perspective view of a detector device according to an embodiment of the present invention.

FIG. 1 illustrates a perspective view (not to scale) of an optical detector device 100 according to an embodiment of the present invention. The optical detector device 100 can be formed from a silicon substrate, which may have one or more layers, or as an integrated circuit structure. The detector device 100 may include a detector 101, a conductor 102 and dielectric filled trenches 103. The detector (photodiode) 101 may be formed in the detector 100 between vertical dielectric filled trenches 103. The trenches 103 may by surrounding the perimeter of the individual detectors 101 isolate the individual detectors 101 from the current paths, or conductors 102. The trenches 103, which can be insulative shell members, can form a first wall adjacent to the photodetectors 101 and a second wall separated from the first wall by a void area. The void are can be enclosed by trenches 103. Top conductors 111 may be provided to electrically connect individual detectors 101 to neighboring conductors 102 across the front or top surface of the detector 100. Although the top conductors 111 are shown to surround the detector 101, light or another form of radiation can be received at the front or top surface of detector 100. In response to the radiation being applied to the respective individual detectors 101, each individual detector 101 generates a charge. The value of the generated charge is dependent upon a variety of factors, including the efficiency of the photodetector region, wavelength of light and the light intensity. Bottom contacts 115A, 115B may be provided on a rear or bottom surface of the detector 100 to drive respective photodiodes 101 and output voltages generated by the respective photodiodes 101. In certain implementations, bottom contact 115A can be used to drive the photodiodes 101 and bottom contact 115B can be used to output the generated voltages. In other embodiments, bottom contact 115B can be used to drive the photodiodes 101 and bottom contact 115A used to output the generated voltages.

The top contact 111 of the photodiode 101 can be connected to the bottom contacts 115A by conductor 102. Conductor 102 can be comprised of at least one or more level metals or formed from a conducting material that can fill a void formed by a first trench 103 wall and a second trench 103 wall. The conductor 102 can be doped silicon or other material to form a current path through the semiconductor die 100. The resistance in the current path formed by the conductor 102 between the bottom contact 115A and the top contact 111 is dependent at least on the total thickness of the silicon or other material wafer forming the detector 100.

Figure 2:
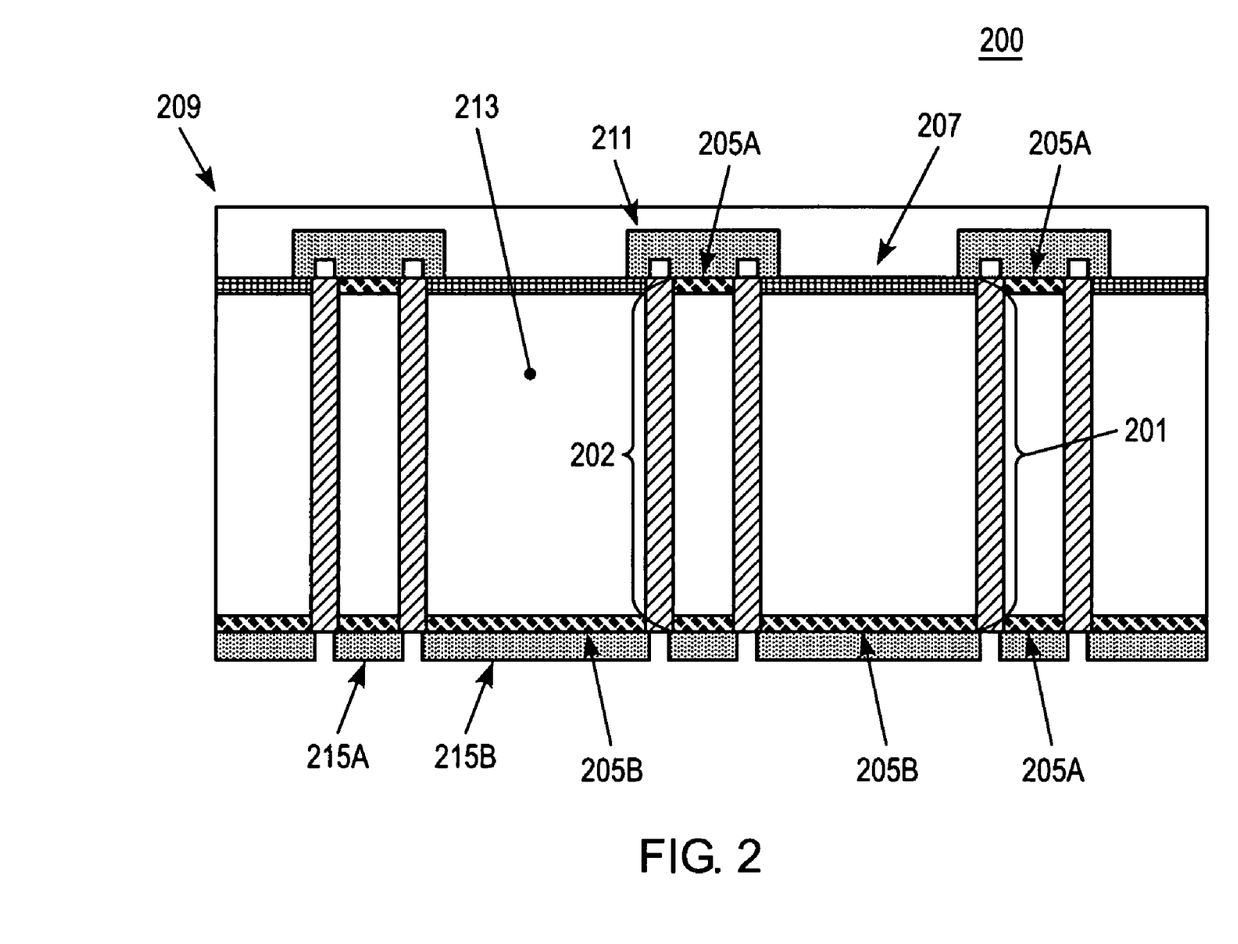
FIG. 2 illustrates a cross sectional view of the detector device illustrated in FIG. 1.

The composition of the photodetector 101 will be described in more detail with reference to FIG. 2. FIG. 2 illustrates a cross sectional view of the optical detector illustrated in FIG. 1.

Optical detector 200 comprises detector 201 and conductor 202. The detector 201 includes ohmic contact regions 205A, 205B and 207. Detector top ohmic contact region 207 covers the top of the detector 201. Ohmic contacts region 205B are located on the top and bottom of conductor 202. The ohmic contact regions 205A and 205B can be doped with either p-type or n-type doping. The ohmic contact region 207 is doped with n-type doping, if 205A and 205B are doped with p-type doping. Alternatively, ohmic contact region 207 can be doped with p-type doping, if 205A and 205B are n-type doping. A top conductor 211 connects all the n-type contacts 207 to the photodiodes 201. The top contact 211 forms a current path via conductor 202 with p-type ohmic contact region 205B.

Photodiodes can be made by doping the detector 201 to produce a p-n junction. When the top of the detector 201 receives radiation, or light, and a charge is generated, a depletion region 213 results near top ohmic region 207. The extent, or height, of the depletion region 213 depends on the background doping or resistivity of the detector 201. A designer can choose either a p-type or an n-type substrate. For example, consider a p-type substrate, where n-type doping 207 is applied to form the top junction of the photodiodes. A p-type ohmic contact region 205A is applied over the entire bottom of the optical detector 200 to form a connection point for electrical connections. A p-type ohmic contact region 205B is also made at the top between the photodiodes 201. Again, as an example, a 200 Ω-cm detector leads to a depletion region 213 of approximately 5 μm resulting in a low capacitance of approximately <20 pF/mm$^2$ at approximately 0 Volts of bias or when operated in a photovoltaic mode. The formation of the photodiodes, including specific doping, can be accomplished by known techniques. The invention should not be limited by the examples described above.

The incident light or radiation passing through ohmic contact region 207 causes the above described charge to be generated between the detector top ohmic contact region 207 and the detector bottom ohmic contact 205B. Additional details of the electrical molecular operation of the detector 201, i.e. photodiodes, will not be described in further detail because it is beyond the scope of this invention.

The entire optical device 200 in some implementations can be planarized using standard processing techniques and passivated as illustrated by surface 209, which may include interlayer dielectrics, SiN, and other passivation materials. Thus, surface 209 can directly, or indirectly, receive the output from scintillators for use with ionizing radiation such as X-rays, γ-rays (gamma-rays) or high-energy particles. Of course, other devices can interface with surface 109 as are known in the prior art.

Figure 3A:
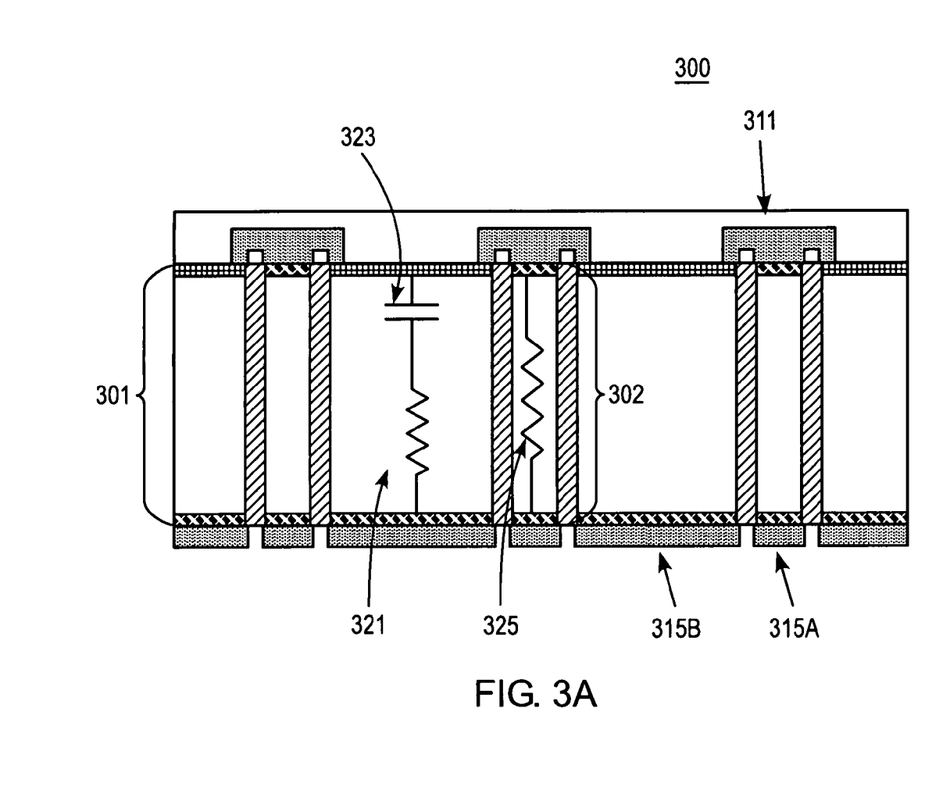
FIGS. 3A, 3B and 3C illustrate a cross sectional view, an electrical equivalent circuit, and an exemplary implementation, respectively, of the detector device illustrated in FIG. 1.
Figure 3B:
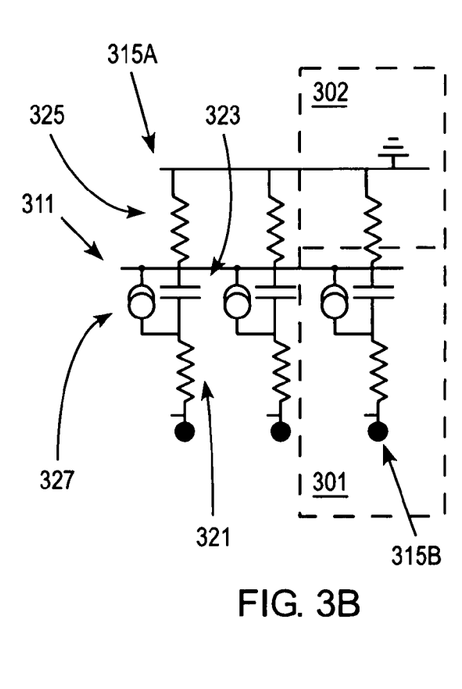

The detectors 201 and conductors 202 form an electrical circuit that will be described in more detail with respect to FIGS. 3A and 3B. FIGS. 3A and 3B illustrate a cross sectional view and an electrical equivalent circuit, respectively, of the optical detector illustrated in FIG. 1. In FIG. 3A, the photodiode 301 is shown as having a capacitance 323 and a resistance 321. The current path of conductor 302 between the top electrode 311 and bottom electrode 315A has a resistance 325. The photodiode 301 has electrical connections at top electrode 311 and bottom electrode 315B.

Schematically, the equivalent circuit of detectors 301, i.e. photodiodes, and current path 302 is shown in FIG. 3B. Resistor 325 represents the ohmic resistance of the contacts 311 and 315A, and resistor 321 and capacitance 323 represents the resistance and capacitance of the photodiode 301 junction. The photocurrent source for each photodiode is shown as 327.

Figure 3C:
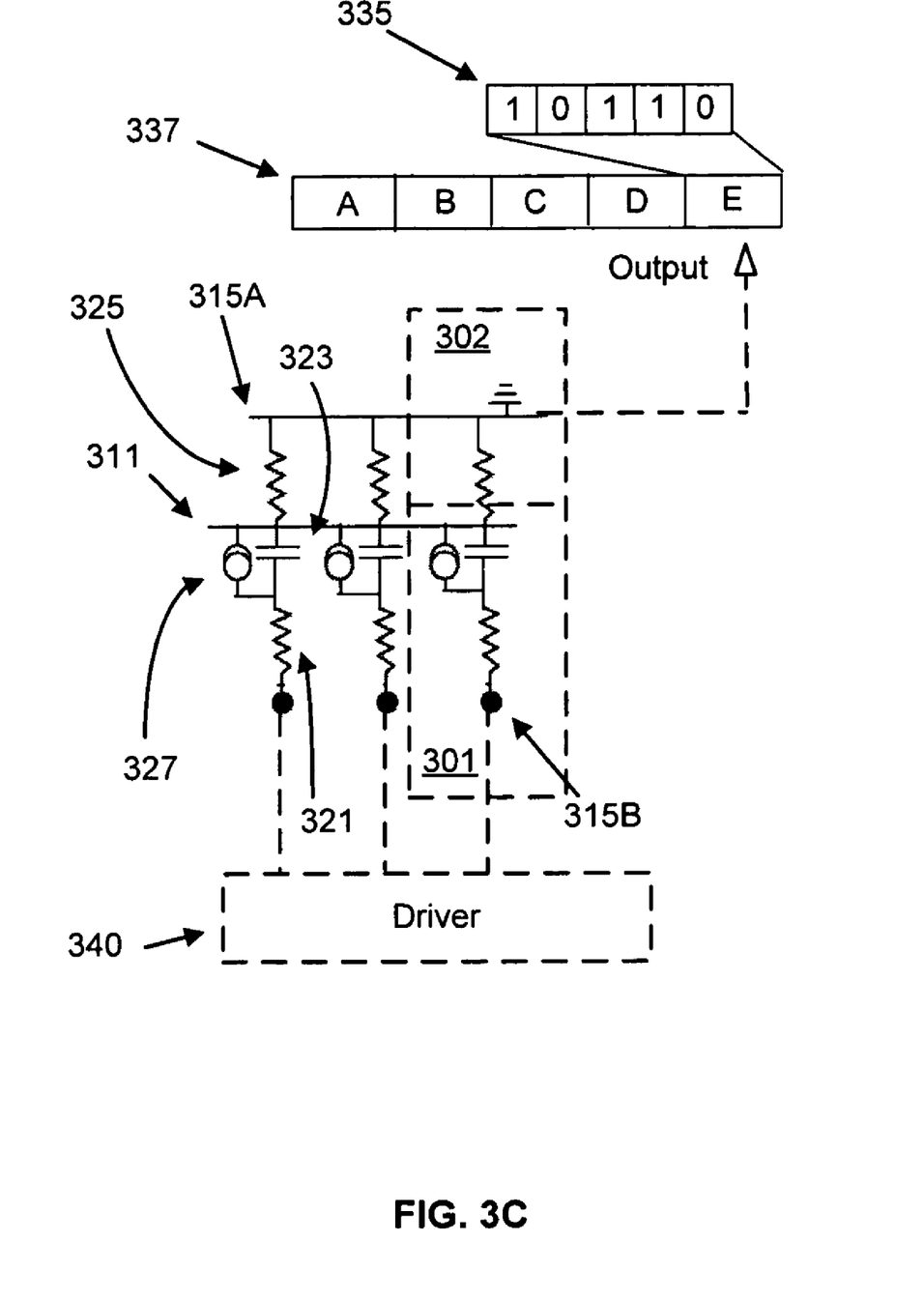

FIG. 3C illustrates an exemplary implementation of a driver 340 and an OUTPUT for reading out data from the individual detectors 301. As shown in FIG. 3C, each photodetector 301 can be individually driven by a signal from driver 340 connected to the bottom or rear of the optical detector 300 at bottom electrode 315B. The output signal can be read out also from the bottom or rear of the optical detector 300 at bottom electrode 315A. The coordination of the read out drive signals can be performed according to known techniques, such as those used with orthogonal addressing imagers. For example, bitline data 335 can be readout from individual photodetectors 301 by successively driving separate detectors 301, and incorporated into wordline data structure 337 for storage and/or processing by circuitry connected to the output without having circuit paths that occlude the front (detector 301 light receiving side) of the optical device 300, or otherwise use area of the front of the optical device 300 that diminishes the performance of the detector 301.

In FIGS. 3A, 3B and 3C, a large photocurrent present in one detector can possibly cause a change in the charge on the adjoining photodetectors because the common electrical contact has a finite resistance. The change in the charge results in a voltage shift due to photocurrent over the finite resistance of the common contact 311, for example. In addition, there can be a relatively large resistance (depending on the resistivity of the silicon wafer 300) between the top electrodes 311 and the bottom contacts 315A and 315B. The large resistance can be avoided by further isolating each photodiode 301 at the top contacts 311. The resulting cross-section and the equivalent circuit are shown in FIGS. 4A and 4B.

Figure 4A:
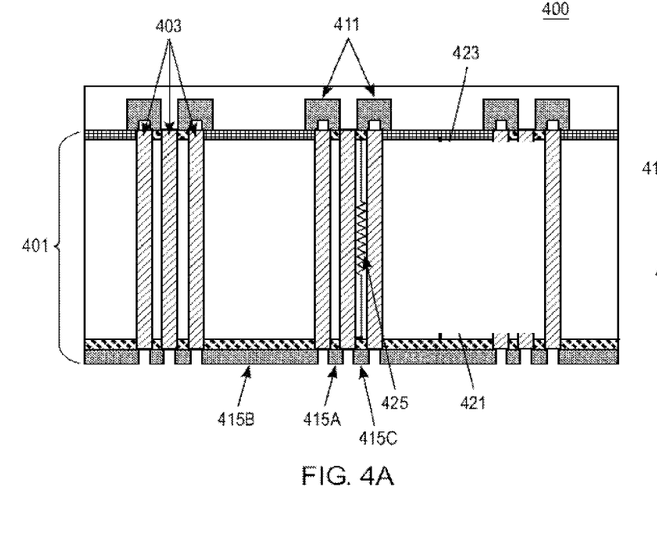
FIGS. 4A, 4B and 4C illustrate another cross sectional view of a detector device, an electrical equivalent circuit, and an exemplary implementation, respectively, according to another exemplary embodiment of the present invention.
Figure 4B:
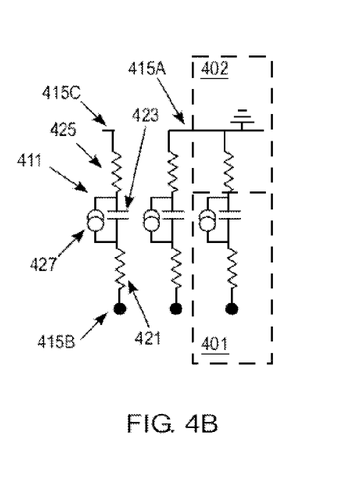

FIGS. 4A and 4B illustrate another cross sectional view of a detector device and an electrical equivalent circuit according to another embodiment of the present invention. In FIG. 4A, the detector photodiodes 401 are completely electrically isolated from one another. Extra isolation trenches 403 are inserted between photodiodes 401. The current path between the top contacts 411 and bottom contacts 415A and 415C has a resistance represented by resistor 425. The photodiodes 401 comprise a resistance 421 and capacitance 423. The detector device 400 is shown with doped region 407 that receives radiation from a radiation source. Top contacts 411 completely surround the doped region 407, which encompasses each photodiode. Trenches 403 are shown in the lateral direction, it should be understood that trenches 403 are also formed in a longitudinal direction as shown in FIG. 1.

The equivalent electrical circuit in FIG. 4B shows an exemplary configuration of photodiodes comprising a photocurrent source 427, a capacitance 423, and a resistance 421. A common electrode is connected preferably only at the bottom ohmic contact 415B where the resistance of the common ground plane connections can be made at very low resistance as compared to the resistance of the substrates. Bottom ohmic contact 415B allows for a first electrical connection to ground and the data connections represented by bottom ohmic contacts 415A and 415C complete the photodiode circuit on the optical device 400. In this embodiment, top contacts 411 do not form a common return path for each photodiode 401 as shown in FIGS. 3A and 3B. In certain implementations, bottom contacts 415A and 415C can be used to drive the photodiodes 401 and bottom contact 415B used to output the generated voltages. In other implementations, bottom contact 415B can be used to drive the photodiodes 401 and bottom contact 415A used to output the generated voltages, in which case, elements 415A, 415C and 415B would be interchanged from the embodiment shown in FIG. 4B. One of ordinary skill in the art would appreciate that bottom ohmic contacts 415A and 415C can be a combined as a single contact and the photodiodes 401 can be alternately driven and read out.

Figure 4C:
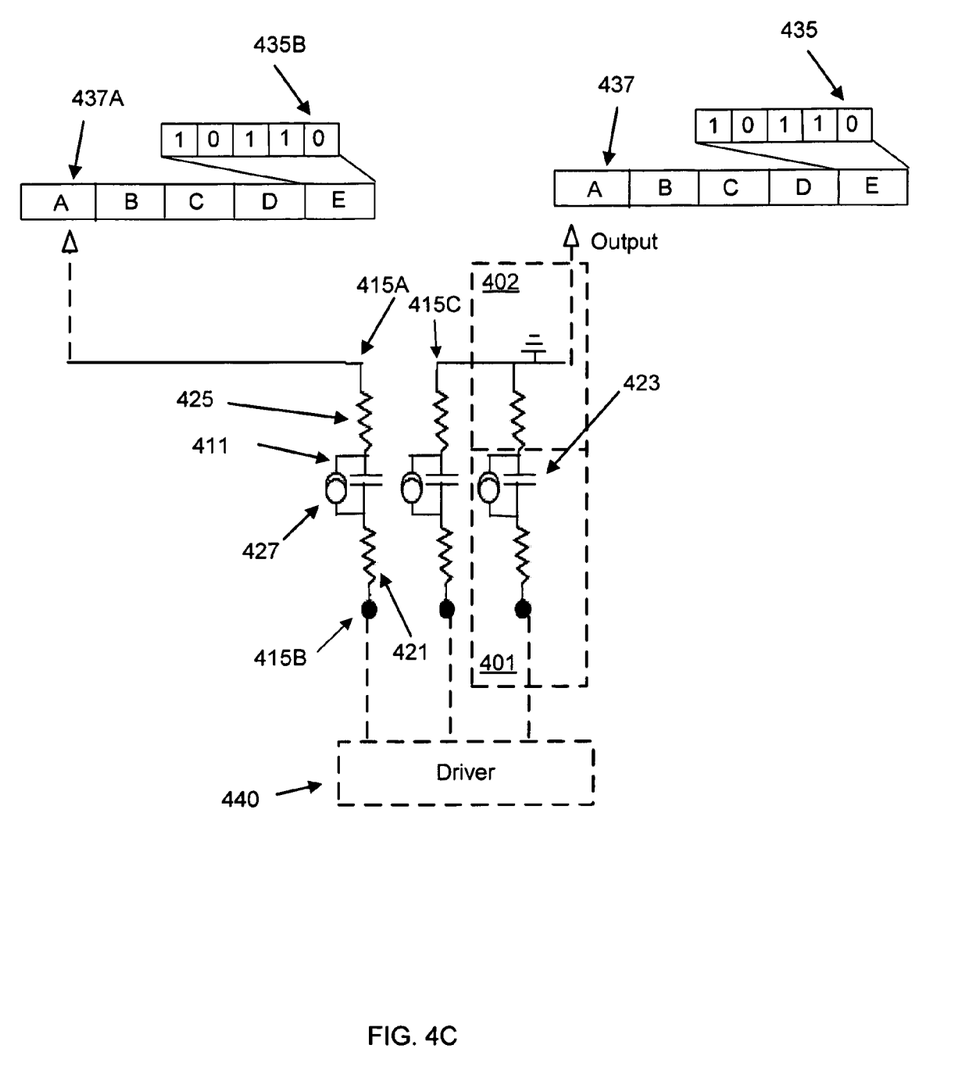

FIG. 4C illustrates an exemplary implementation of a driver 440 and an OUTPUT for reading out data from the individual detectors 401. As shown in FIG. 4C, each photodetector 401 can be individually driven by a signal from driver 440 connected to the bottom or rear of the optical detector 400 at bottom electrode 415B. The output signal based on the photocurrent source 427 can be read out also from the bottom or rear of the optical detector 400 at bottom electrode 415A and 415C. The coordination of the read out drive signals can be performed according to known techniques, such as those used with orthogonal addressing imagers. For example, bit-line data 435 can be readout from individual photodetectors 401 by successively driving separate detectors 401, and incorporated into wordline data structure 437 for storage and/or processing by circuitry connected to the output without having circuit paths that occlude the front (detector 401 light receiving side) of the optical device 400, or otherwise use area of the front of the optical device 400 that diminishes the performance of the detector 401. By having two bottom ohmic contacts 415A and 415C on a portion of the bottom contacts as shown in FIG. 4A, each photodiode is isolated from the others on both electrodes. We show in 4B that all the current path resistance 425 are brought together through a single 415A electrode in some instances. In an adjacent electrode, the current path resistance 425 is separated from one another and connect to bottom ohmic contacts 415A and 415C. This separation in a few groups of bottom contacts 415A and 415C eases system level connections, and mitigates the associated undesirable ground loop).

One of skill in the art may find that the lowest noise performance of an amplifier connected to these photodiodes can be achieved with low photodiode capacitance and low contact resistance. These opposing requirements are particularly difficult to meet when the photodiodes are operated in a photovoltaic mode for low-noise performance. As shown in FIGS. 4A and 4B, these are fundamentally opposing requirements. Low capacitance can be achieved only with high resistivity substrates that also increases the contact resistances 421 and 425. These opposing requirements may be fulfilled by two methods. In a first method, the designer can start with a silicon-to-silicon bonded wafer (without glass in between) in which one wafer is high resistivity and the other is of low resistivity. A second method is to grow a silicon epi-layer on a thicker lower resistivity wafer while maintaining high resistance. Bonded wafers have recently become available and are likely to provide better resistivity control than epi-growth due to diffusion of dopings during long growth of tens of microns of photodiode layer.

Figure 5:
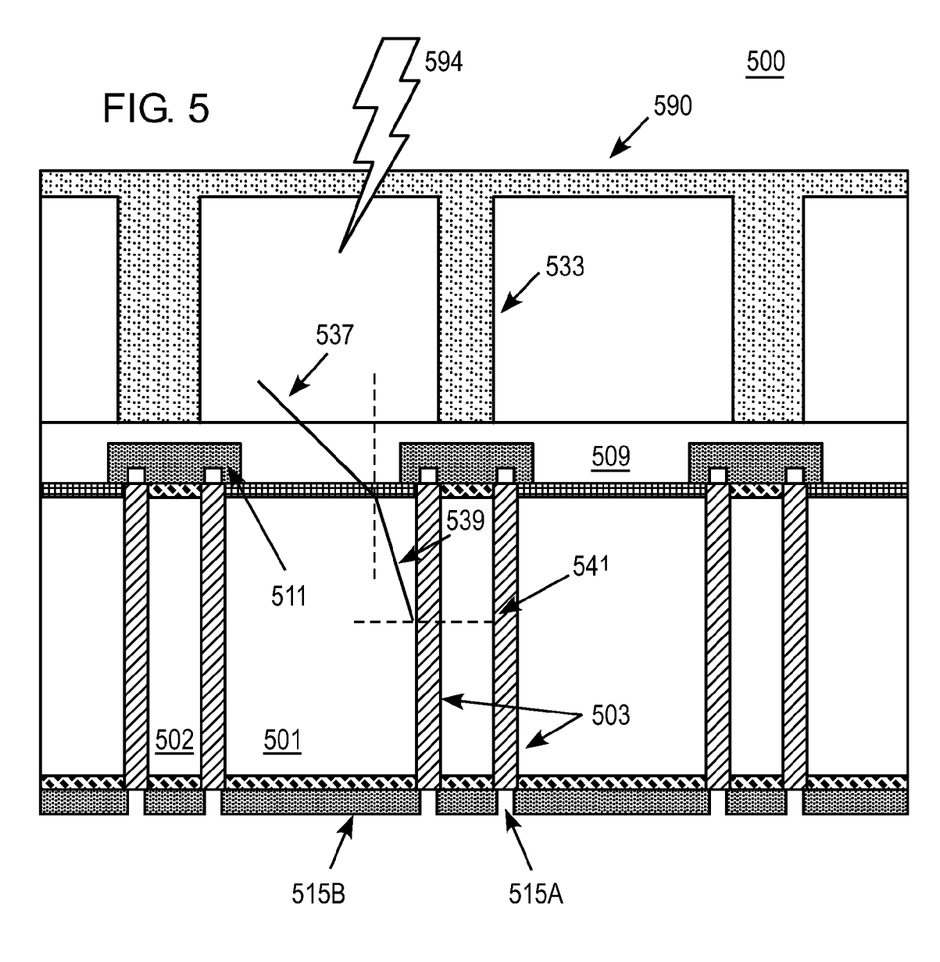
FIG. 5 illustrates a scintillator implementation of an exemplary embodiment of the present invention.

FIG. 5 illustrates a scintillator implementation of an exemplary embodiment of the present invention. The device 500 includes scintillator 590, photodiode 501, trenches 503, top contacts 511, bottom ohmic contacts 515A and 515B. The electrical connections and operation are similar as that explained with respect to FIGS. 1-4B, and a description of which is not repeated for sake of repetition.

This exemplary embodiment of the optical device 500 reduces the cross-talk between pixels in a CT scanner or an X-ray inspection system. This is because dielectric between the silicon is likely to have refractive index far lower than silicon and thus photons coming in vertically will be highly reflected at the boundary between silicon and the dielectric. Any photon emitted from the scintillator 590 above the photodiode 501 will have a angle of refraction in silicon of less than $$\sin^{-1}(n_{scintillator}/n_{si}).$$

Most scintillator 590 materials have a refractive index around approximately 1.4 to 2.0. Thus, the angle of refraction is less than 30 degrees. This is because the refractive index of silicon is greater than 3.5 in the region of 300 nm to 900 nm. The angle of incidence on the dielectric interface with respect to normal 541 is approximately greater than 60 degrees resulting in total internal reflection. Again this follows because the insulating dielectric in the trench 503 has a refractive index between approximately 1.4 and 2.0 with typical values being close to refractive index of glass around 1.5. Thus, the angle of incidence on the vertical interface will always be greater than the critical angle and total internal reflection will completely confine the rays. This confinement leads to improved performance of the sensor system due to reduced cross-talk and increased collection efficiency.

For example, photon 594, such as an X-ray, causes release of optical photon that follows trajectory 537 from the scintillator 590 through planarized surface 509. Scintillator 590 is surrounded by optically reflective medium 533 that isolates adjoining scintillators and confines optical photons. The photon will refract in silicon to follow trajectory 539 in which the angle of refraction is preferably less than 30 degrees. This is because the refractive index of silicon is greater than 3.5 in the region of 300 nm to 900 nm. The angle of incidence on the dielectric interface with respect to normal 541 is greater than 60 degrees resulting in total internal reflection.

Figure 6:
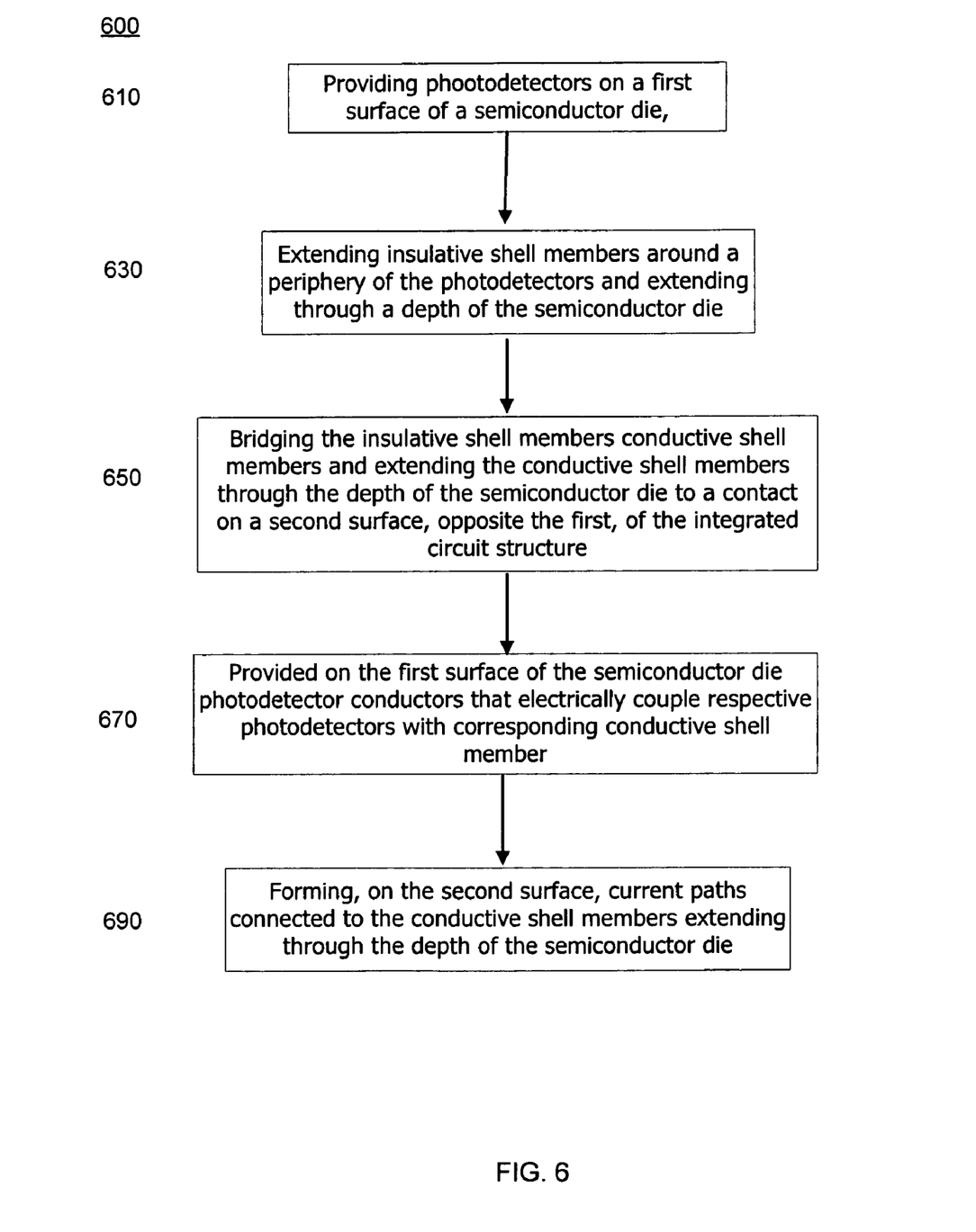
FIG. 6 is a flowchart of a process for making a detector device according to an exemplary embodiment of the present invention.

The above-described exemplary detector devices can be made by an exemplary process illustrated in FIG. 6. FIG. 6 is a flowchart of a process for making detector device according to an exemplary embodiment of the present invention. In step 610 of FIG. 6, photodetectors are provided on a first surface of a semiconductor die. Insulative shell members are extended around a periphery of the photodetector and extended through a depth of the semiconductor die, 630. The insulative shell members connecting around conductive shell members and extending the conductive shell members through the depth of the semiconductor die to a contact on a second surface, opposite the first, of the integrated circuit structure, 650. In step 670, photodetector conductors are provided on the first surface of the semiconductor die that electrically couple respective photodetector with corresponding conductive shell members. On the second surface, current paths are formed connected to the conductive shell members extending through the depth of the semiconductor die, 690. Detector devices 500 constructed in this manner require few steps, are capable of excellent uniformity, avoid electrical cross-talk, and also provide optical isolation of the incoming photons from passing over from one photodetector to the other. This process can form a photodetector device as described with respect to FIGS. 1-5 and 7.

This construction method lowers the cost of the silicon photodetectors operated in the photovoltaic mode or those that require "rear-illumination". It simplifies manufacturing by leveraging recent innovations in silicon processing. It provides a silicon photodetector formed from bonded substrates; a single silicon wafer made from bonding two or more silicon wafers of widely differing resistivity. This allows a photodiode region to have a high resistivity (which lowers the capacitance and increases the responsivity) while the contact regions can have low resistivity. The dielectric isolation improves both electrical and optical pixel-to-pixel crosstalk in an array.

Figure 7:
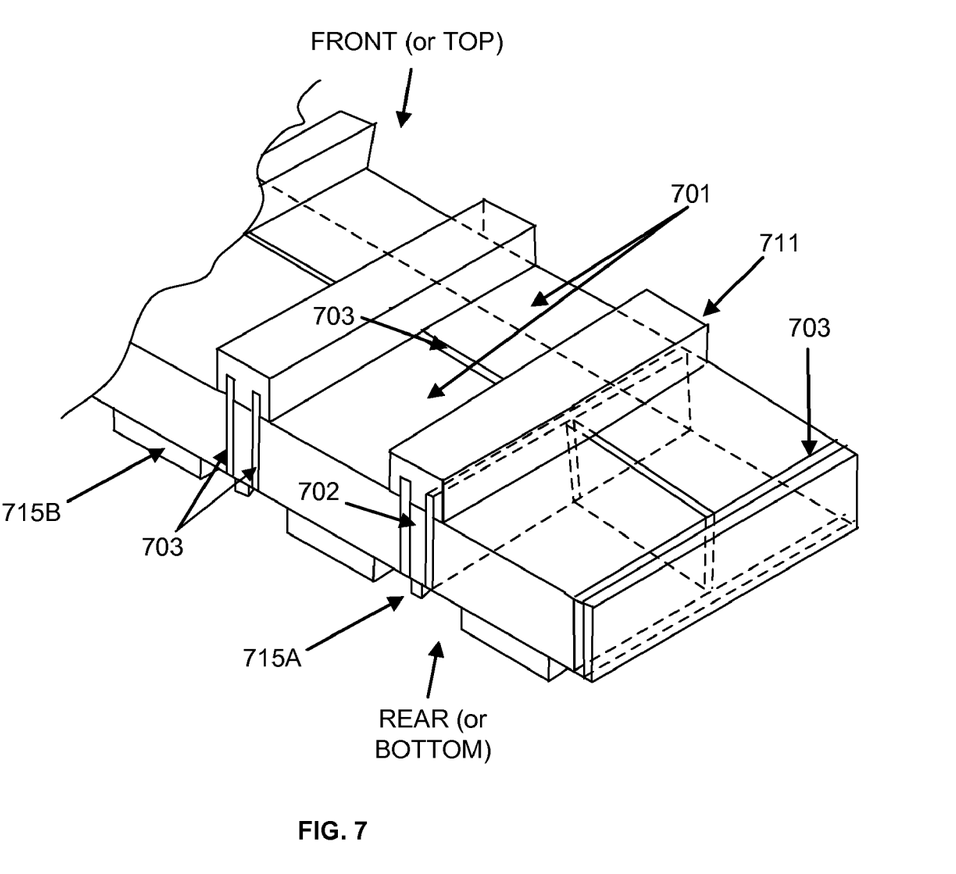
FIG. 7 illustrates a perspective view of an alternative configuration according to an exemplary embodiment of the present invention.

Alternative configurations of the semiconductor die are also possible. FIG. 7 illustrates a perspective view (not to scale) of an alternative configuration according to an exemplary embodiment of the present invention. FIG. 7 illustrates a semiconductor die 700 comprising detector 701, a conductor 702 and dielectric filled trenches 703. The detector (photodiode) 701 may be formed in the semiconductor die 700 between vertical dielectric filled trenches 703. The trenches 703 may isolate individual detectors 701 from the current paths, or conductors 702, by surrounding the perimeter of the individual detectors 701. The conductors 702 can be formed on a side(s) of the individual detectors 701, thereby reducing the number of trenches 103 and improving the "fill factor" of the semiconductor die 700. The conductors 702 do not have to surround the detector 702 as shown in FIG. 1. Top conductors 711 may be provided over certain trenches 703 to electrically connect individual detectors 701 to neighboring conductors 702 across the front or top surface of the detector 700. Bottom contacts 715A, 715B may be provided on a rear or bottom surface of the detector 700 to drive respective photodiodes 701 and output voltages generated by the respective photodiodes 701. In an exemplary embodiment, bottom contact 715A can be used to drive the photodiodes 701 and bottom contact 715B used to output the generated voltages. In another embodiment, bottom contact 715B can be used to drive the photodiodes 701 and bottom contact 715A can be used to output the generated voltages.

Those skilled in the art can appreciate from the foregoing description that the present invention can be implemented and constructed in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

What is claimed is:

1. An integrated circuit structure, comprising:
a semiconductor die having photodetectors provided on a first surface thereof,
insulative shell members extending around a periphery of the photodetectors and extending through a depth of the semiconductor die,
conductive shell members bridging the insulative shell members and extending through the depth of the semiconductor die, and
photodetector conductors, provided on the first surface of the semiconductor die and electrically coupling respective photodetectors with corresponding conductive shell members.

2. The integrated circuit structure of claim 1, the insulative shell members comprising:

a first wall adjacent to the photodetectors extending the depth of the semiconductor die;
a second wall separated from the first wall by a void area, the second wall extending the depth of the semiconductor die; and
a conductor material filling the void area between the first wall and the second wall.

3. The integrated circuit structure of claim 2, further comprising:
a contact located on a bottom side of the integrated circuit structure connecting to the conductor material.

4. The integrated circuit structure of claim 3, further comprising:
a current path for bitline readout of a voltage generated by the photodetectors for incorporation into a wordline data structure.

5. The integrated circuit structure of claim 3, further comprising:
a portion of a plurality of the contacts located at the bottom side of the integrated circuit structure are connected to only an individual photodiode.

6. The integrated circuit structure of claim 1, wherein the photodetectors have a substantially circular area.

7. The integrated circuit structure of claim 1, wherein the photodetectors have a polygonal area.

8. The integrated circuit structure of claim 1, further comprising a scintillator covering layer for receiving incident radiation, wherein the incident radiation is totally reflected within the photodetector.

9. A silicon wafer, comprising:
substrate layers bonded together having a first side for receiving radiation and a second side for making electrical connections, the substrate layers doped to provide a photodiode capability between the first side and the second side;
a plurality of insulating regions formed through the substrate layers from the first side to the second side and open on the ends, each of the plurality of insulating regions enclosing a portion of the substrate layers, the enclosed portion of the substrate layers forming a photodiode, and enclosing an insulating region via adjacent to the photodiode; and
an electrical contacting material bridging the plurality of insulating regions on the first side of the substrate layers connected to an electrical connection region on the second side of the substrate layers through the insulating region via.

10. The silicon wafer of claim 9, further comprising:
a metal strip passing through the insulating region via to connect the electrical contacting material on the first side of the bonded substrate layers to the second side of the bonded substrate layers.

11. The silicon wafer of claim 9, wherein the insulating region via comprises:
substrate layers forming an electrical conductor between the electrical contacting material on the first side of the bonded substrate layers to the second side of the bonded substrate layers.

12. The silicon wafer of claim 9, further comprising:
a current path on the second side of the substrate layers for bitline readout of a voltage generated by the photodetector receptors for incorporation into a wordline data structure.

13. An integrated circuit structure formed by the process of:
providing photodetectors on a first surface of a semiconductor die, extending insulative shell members around a periphery of the photodetector and extending through a depth of the semiconductor die, producing, in the semiconductor die, conductive paths adjacent to an insulative shell member, bridging the insulative shell members with conductive shell members and extending connections from the conductive shell members through the depth of the semiconductor die via the conductive paths to a contact on a second surface, opposite the first, of the integrated circuit structure, provided on the first surface of the semiconductor die photodetector conductors that electrically couple respective photodetectors with corresponding conductive shell members, and forming, on the second surface, current paths connected to the conductive shell members extending through the depth of the semiconductor die.

14. The process of claim 13, wherein the providing photodetector comprises:

doping the semiconductor die to form a photodetector.

15. The process of claim 13, wherein the extending connections comprises:

connecting a metal strip to the conductive shell members; and passing the metal strip through the conductive path to the contact on the second surface.

16. The process of claim 13, further comprising:

implementing a current path on the second side of the substrate layers for bitline readout of a voltage generated by the photodetectors for incorporation into a wordline data structure.

* * * * *

UNITED STATES PATENT AND TRADEMARK OFFICE
CERTIFICATE OF CORRECTION

PATENT NO. : 7,737,409 B2  Page 1 of 3
APPLICATION NO. : 12/138078
DATED : June 15, 2010
INVENTOR(S) : Deliwala et al.

It is certified that error appears in the above-identified patent and that said Letters Patent is hereby corrected as shown below:

Delete Title Page, and substitute new Title Page. (Attached)

On the Title Page:

The first or sole Notice should read --

Subject to any disclaimer, the term of this patent is extended or adjusted under 35 U.S.C. 154(b) by 184 days.

In the drawings,

Delete the drawing labeled "FIG.1" and substitute the correct Figure 1 as shown on the attached page.

Signed and Sealed this
Twenty-eighth Day of December, 2010

David J. Kappos
*Director of the United States Patent and Trademark Office*

(12) United States Patent
Deliwala et al.

(10) Patent No.: US 7,737,409 B2
(45) Date of Patent: Jun. 15, 2010

(54) SILICON DETECTOR AND METHOD FOR CONSTRUCTING SILICON DETECTORS

(75) Inventors: Shrenik A. Deliwala, Andover, MA (US); Michael C Coln, Lexington, MA (US); Alain Valentin Guery, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 144 days.

(21) Appl. No.: 12/138,078

(22) Filed: Jun. 12, 2008

(65) Prior Publication Data

US 2009/0309036 A1 Dec. 17, 2009

(51) Int. Cl.
*G01T 1/24* (2006.01)
(52) U.S. Cl. .................................. 250/370.01
(58) Field of Classification Search . 250/370.1–370.15; 378/98.8; 257/233, 301, 117, 118, 127, 170, 257/244, 332, 374, 397, 510, 513, 514, 515, 257/519, 520, 534, 559, 571, 586, 594, 599, 257/622, E27.126, E29.121, E29.201, E29, 257/618, 535, 527, 500, 499, 311, 304, 260, 257/E29.26, E21.231, E21.238, E21.553, 257/E21.585, 929
See application file for complete search history.

(56) References Cited

U.S. PATENT DOCUMENTS

| | | | | |
|---|---|---|---|---|
| 3,864,722 A | * | 2/1975 | Carnes | 257/231 |
| 4,029,962 A | * | 6/1977 | Chapman | 250/338.4 |
| 4,278,046 A | * | 7/1981 | Clarke et al. | 118/695 |
| 5,525,828 A | | 6/1996 | Bassous et al. | |
| 6,114,805 A | * | 9/2000 | Codama et al. | 313/509 |
| 2003/0022475 A1 | | 1/2003 | Vieux-Rochaz et al. | |

FOREIGN PATENT DOCUMENTS

| EP | 0926726 A1 | 6/1999 |
|---|---|---|
| EP | 1569275 A1 | 8/2005 |
| WO | 2004084300 A1 | 9/2004 |

* cited by examiner

*Primary Examiner*—David P Porta
*Assistant Examiner*—Kiho Kim
(74) *Attorney, Agent, or Firm*—Kenyon & Kenyon LLP (57) ABSTRACT

Described is a die having photodetectors provided on a first surface thereof. The die includes an insulative shell member, a conductive shell member and a photodetector conductor. The insulative shell member extends around a periphery of the photodetector receptors and extending through a depth of the semiconductor die. The conductive shell member bridges the insulative shell member and extends through the depth of the semiconductor die. The photodetector conductors are provided on the first surface of the semiconductor die and electrically couple respective photodetectors with a corresponding conductive shell member. Also described is a process for making a semiconductor die and an integrated circuit structure.

16 Claims, 9 Drawing Sheets

FIG. 1